(12) United States Patent
Fujimoto

(10) Patent No.: US 8,030,929 B2
(45) Date of Patent: Oct. 4, 2011

(54) COIL AND MRI SYSTEM

(75) Inventor: Masahiro Fujimoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 248 days.

(21) Appl. No.: 12/390,597

(22) Filed: Feb. 23, 2009

(65) Prior Publication Data

US 2009/0219025 A1    Sep. 3, 2009

(30) Foreign Application Priority Data

Feb. 29, 2008    (JP) .................................. 2008-049437

(51) Int. Cl.
*G01V 3/00* (2006.01)
(52) U.S. Cl. ...................................................... 324/318
(58) Field of Classification Search ........... 324/300–322
See application file for complete search history.

(56) References Cited

U.S. PATENT DOCUMENTS

| | | |
|---|---|---|
| 5,304,932 A | 4/1994 | Carlson |
| 5,572,129 A | 11/1996 | Carlson |
| 5,573,000 A | 11/1996 | Goffer et al. |
| 5,592,087 A | 1/1997 | Richard et al. |
| 5,646,530 A | 7/1997 | Strenk et al. |
| 5,760,583 A | 6/1998 | Sato et al. |
| 6,348,794 B1 | 2/2002 | Nabetani et al. |
| 6,437,567 B1 | 8/2002 | Schenck et al. |
| 6,510,035 B2 | 1/2003 | Sato |
| 6,985,775 B2 * | 1/2006 | Reinke et al. ................. 607/116 |
| 7,026,818 B2 | 4/2006 | Machida et al. |
| 7,061,242 B2 | 6/2006 | Ochi et al. |
| 7,157,911 B2 | 1/2007 | Suzuki et al. |
| 7,176,689 B2 | 2/2007 | Machida et al. |
| 2002/0190715 A1 | 12/2002 | Marek |
| 2003/0132750 A1 | 7/2003 | Machida et al. |
| 2004/0061498 A1 | 4/2004 | Ochi et al. |
| 2005/0231201 A1 | 10/2005 | Fujimoto et al. |
| 2010/0253333 A1 * | 10/2010 | Zhai et al. ..................... 324/307 |

FOREIGN PATENT DOCUMENTS

JP    08-252234    10/1996

* cited by examiner

*Primary Examiner* — Dixomara Vargas
(74) *Attorney, Agent, or Firm* — Armstrong Teasdale LLP

(57) ABSTRACT

A coil includes a coil element to receive MR signals with a first frequency from a subject. The coil element includes a main current path section in which an MR current arising due to electromagnetic induction of the MR signals with said first frequency flows, and a current blocking section that makes smaller than said MR current an electromagnetic current flowing in said main current path section due to electromagnetic induction of electromagnetic waves with a second frequency different from said first frequency.

18 Claims, 8 Drawing Sheets

COIL AND MRI SYSTEM

CROSS REFERENCE TO RELATED APPLICATIONS

This application claims the benefit of Japanese Patent Application No. 2008-049437 filed Feb. 29, 2008, which is hereby incorporated by reference in its entirety.

BACKGROUND OF THE INVENTION

The embodiments described herein relate to a coil receiving MR signals from a subject, and an MRI (magnetic resonance imaging) system including the coil.

A reception coil for receiving MR signals from a subject is employed in MRI apparatus.

The reception coil known from, for example Japanese Patent Application No. Hei 08-252234, has a problem in which application of low frequency noise to the reception coil results in artifacts such as ghosts appearing in an MR image.

BRIEF DESCRIPTION OF THE INVENTION

It is desirable that the problem described previously is solved.

In a first aspect of the invention, a coil includes a coil element to receive MR signals with a first frequency from a subject, the coil element including: a main current path section in which an MR current arising due to electromagnetic induction of the MR signals with the first frequency flows; and a current blocking section that makes smaller than the MR current an electromagnetic current flowing in the main current path section due to electromagnetic induction of electromagnetic waves with a second frequency different from the first frequency.

In a second aspect of the invention, an MRI system includes the coil of the invention.

The coil of the invention includes the current blocking section. The current blocking section is able to make the electromagnetic current flowing in the main current path section due to electromagnetic induction of electromagnetic waves with the second frequency smaller than the MR current flowing in the main current path section. Thus, even if the current with the second frequency arises in the coil element because of noise or the like, this current becomes smaller than the MR current produced by the MR signals with the first frequency and an MR image in which artifacts such as ghosts are reduced is obtained.

Because the MRI system of the invention include the coil of the invention, an MR image in which artifacts such as ghosts are reduced is obtained by the use of the MRI system of the invention.

Further objects and advantages of the present invention will be apparent from the following description of the preferred embodiments of the invention as illustrated in the accompanying drawings.

DETAILED DESCRIPTION OF THE INVENTION

In the following, various embodiments of the invention will be described in detail with reference to the drawings. It should be noted that the invention is not limited to the embodiments described herein.

Figure 1:
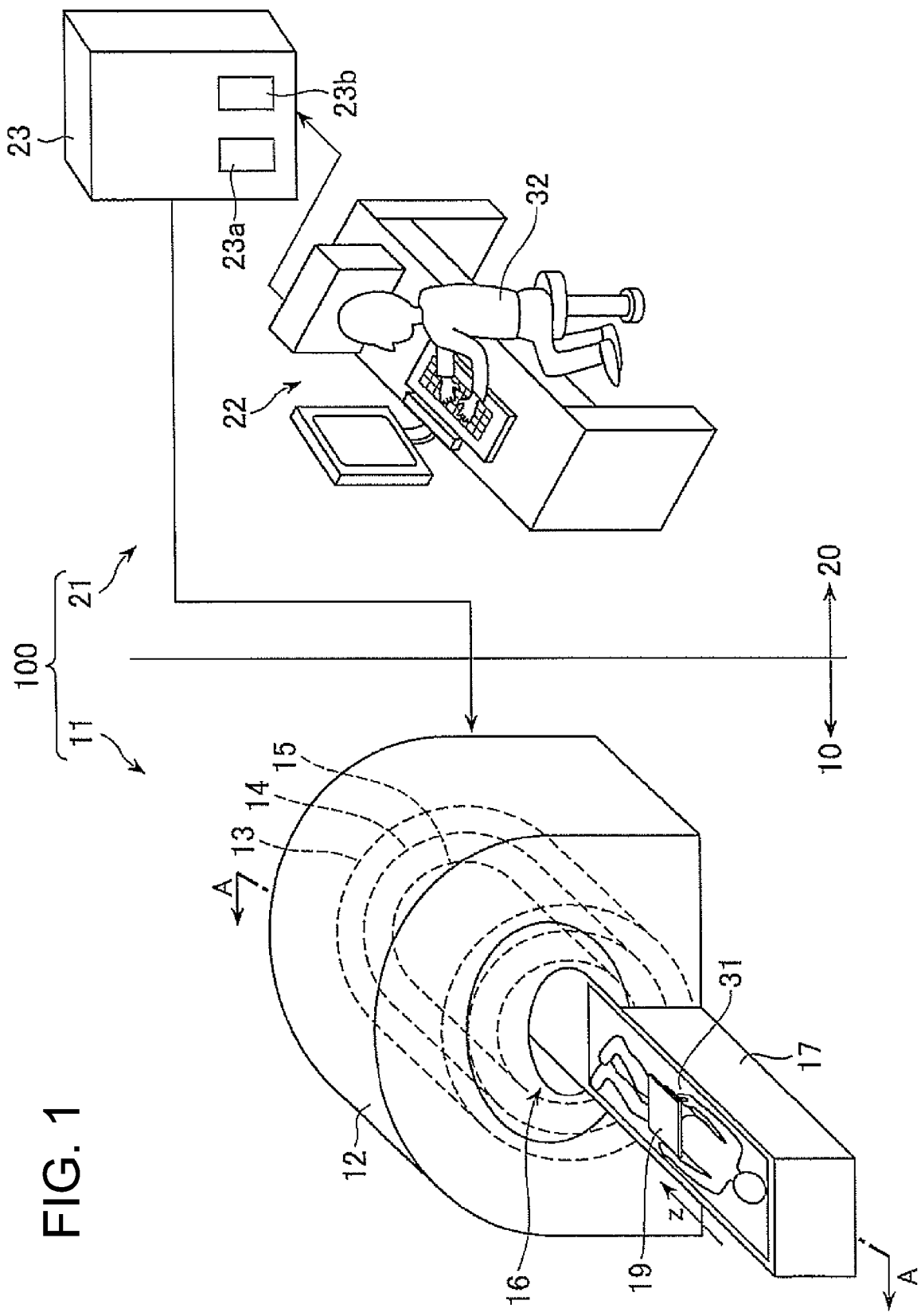
FIG. 1 is a perspective view of an MRI system.

FIG. 1 is a perspective view of an MRI (Magnetic Resonance Imaging) system 100.

The MRI system 100 includes an MRI apparatus 11 and control equipment 21 for control of the MRI apparatus 11. The MRI apparatus 11 is installed in an MRI room 10 and the control equipment 21 is installed in a monitor room 20.

Figure 2:
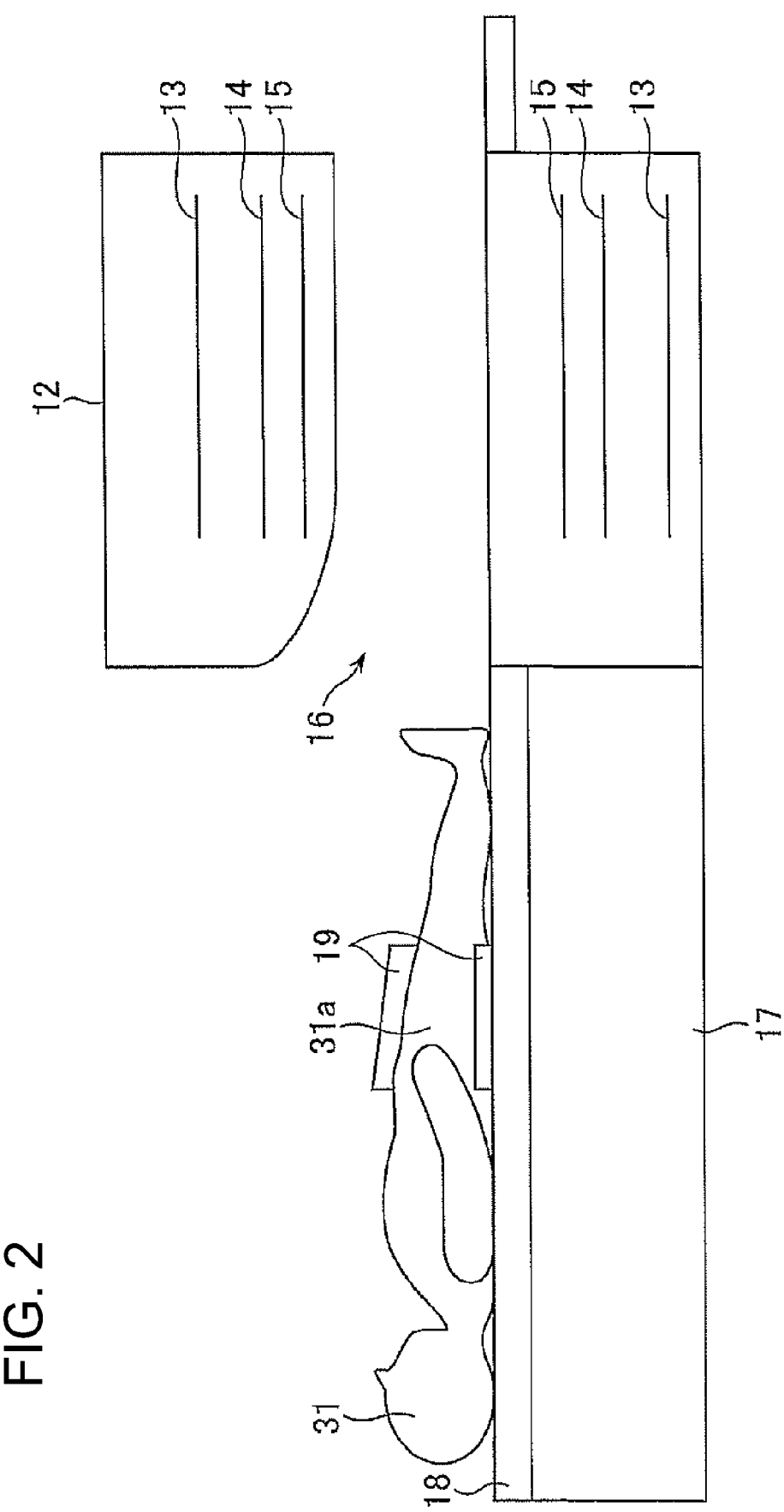
FIG. 2 is an A-A sectional view of an MRI apparatus shown in FIG. 1.

FIG. 2 is an A-A sectional view of the MRI apparatus 11 shown in FIG. 1.

The MRI apparatus 11 includes an MRI main body 12 and a table 17.

The MRI main body 12 includes a superconducting magnet 13, a gradient coil 14, and a transmission coil 15.

The table 17 has a cradle 18. A subject 31 lies on the cradle 18. Two reception coils 19 are attached to the subject 31 such that they are disposed in up and down positions between which a portion to be imaged 31a of the subject 31 is sandwiched.

Figure 3:
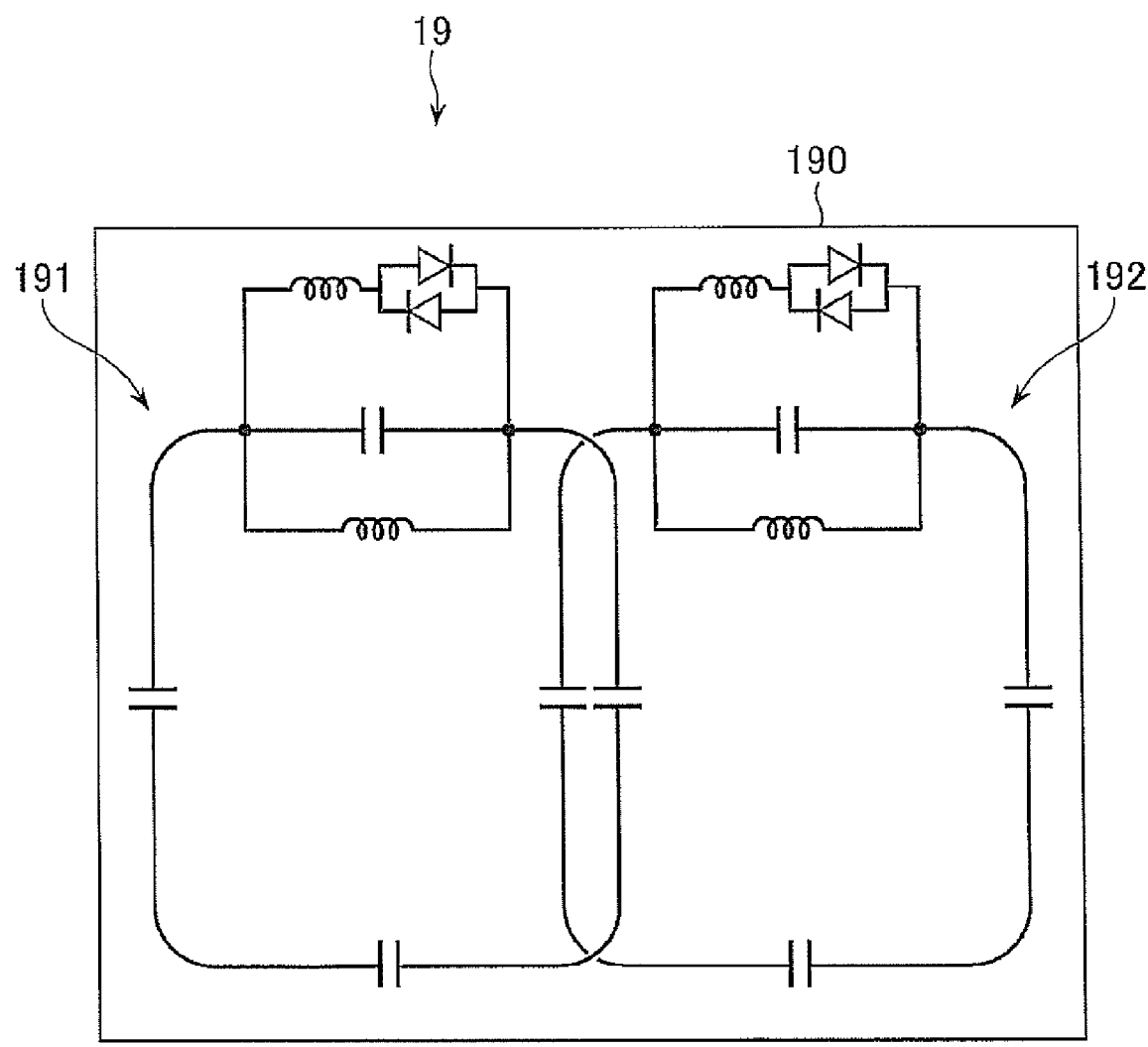
FIG. 3 is a plan view of a reception coil shown in FIGS. 1 and 2.

FIG. 3 is a plan view of a reception coil 19.

The reception coil includes two coil elements 191 and 192, and a coil casing 190 containing these coil elements 191 and 192. The coil elements 191 and 192 are disposed such that they partially overlap each other to reduce coupling between the coil elements 191 and 192.

Then, the coil elements 191 and 192 are explained. Because the coil elements 191 and 192 have the same structure, specifically, an explanation of a coil element 191 will be given below.

Figure 4:
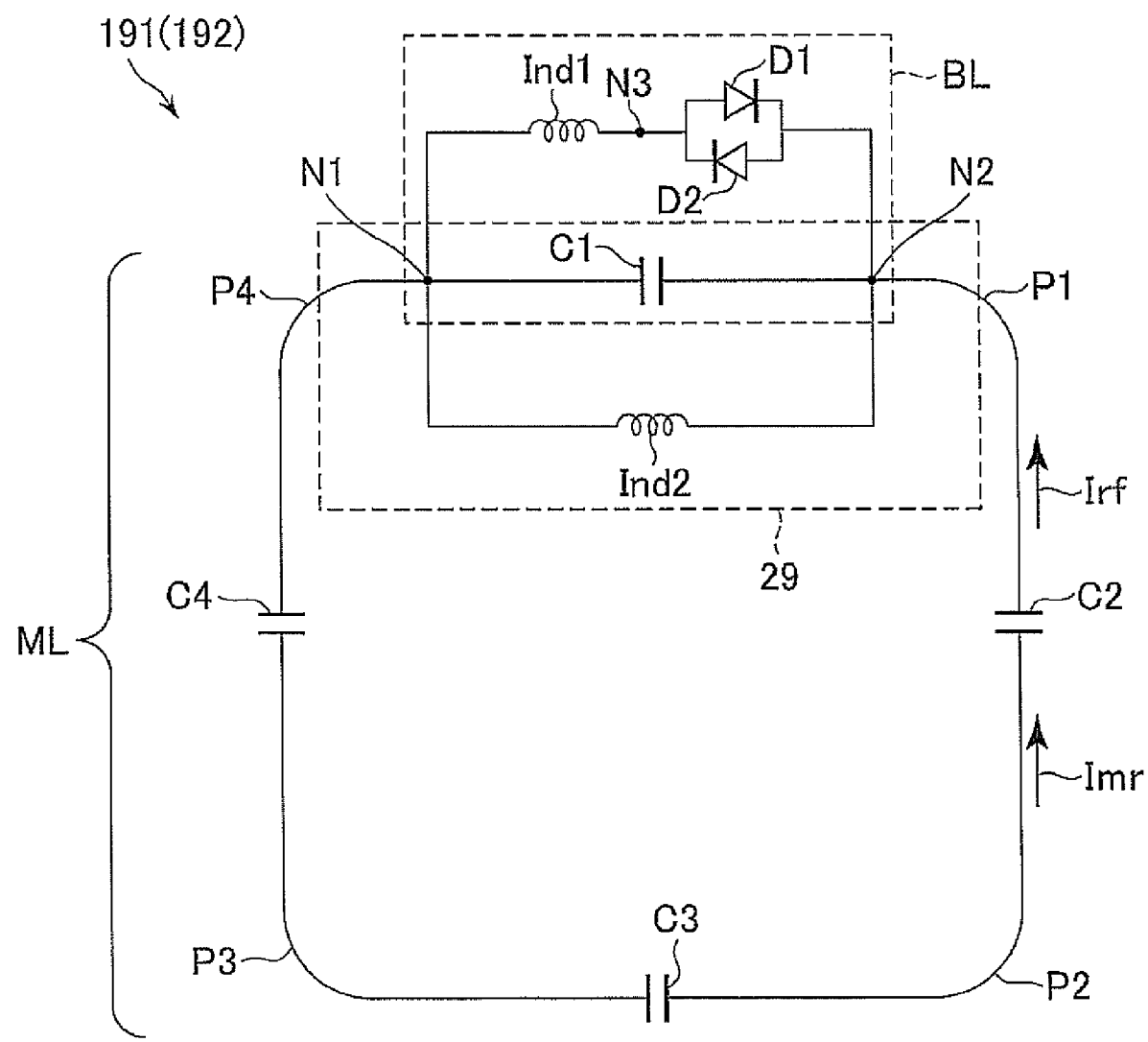
FIG. 4 is an enlarged view of an exemplary coil element shown in FIG. 3.

FIG. 4 is an enlarged view of the coil element 191.

The coil element 191 includes a main current path section ML. The main current path section ML includes four coil element pieces P1 to P4 and four capacitors C1 to C4. The four coil element pieces P1 to P4 are connected by the four capacitors C1 to C4 to form a loop.

The coil element 191 also includes a blocking circuit BL whereby the coil element 191 can be set in a disabled state. The blocking circuit BL includes an inductor Ind1 and two diodes D1 and D2 which are connected in parallel, directed in opposite directions. The diodes D1 and D2 are connected in series to the inductor Ind1. A series circuit formed by the inductor Ind1 and the diodes D1 and D2 is connected in parallel to a capacitor C1 of the main current path section ML. The blocking circuit BL is made up of the inductor Ind1, diodes D1 and D2, and capacitor C1.

The coil element 191 further includes a low frequency current blocking section 29. The low frequency current blocking section 29 includes an inductor Ind2. This inductor Ind2 is connected in parallel to the capacitor C1 of the main current path section ML. The low frequency current blocking section 29 is made up of the inductor Ind2 and capacitor C1. The reason why the coil element 191 includes the low frequency current blocking section 29 will be described in detail later.

The coil element 191 is constituted as described above. In the present embodiment, the main current path section ML of the coil element 191 has a substantially rectangular shape. However, the main current path section ML may have another shape not the rectangular (for example, a figure of 8 shape).

The other coil element 192 (see FIG. 3) has the same circuit configuration as depicted in FIG. 4.

The reception coil 19 includes the two coil elements 191 and 192 having the circuit configuration depicted in FIG. 4. Although the reception coil 19 includes the two coil elements 191 and 192 in the present embodiment, the reception coil 19 may include a single coil element or more than two coil elements.

The coil elements 191 and 192 each have the main current path section ML. However, the coil elements 191 and 192 do not always need to have the main current path section of the same shape. For instance, the coil element 191 may have the main current path section ML, whereas the other coil element 192 may have another shape of main current path section (which has, for example, a figure of 8 shape).

The MRI apparatus 11 has two reception coils 19 each having the constitution as depicted in FIG. 3. The two reception coils 19 are attached to the subject 31 such that they are disposed in up and down positions between which the portion to be imaged 31a of the subject 31 is sandwiched, as depicted in FIG. 2.

Returning to FIG. 1, explanation continues.

The MRI apparatus 11 is controlled by the control equipment 21. The control equipment 21 includes an operating console 22 and a cabinet 23. The cabinet 23 supplies power to the MRI apparatus 11 and processes MR signals received by the reception coils 19. The cabinet 23 includes a gradient coil power supply 23a that supplies power to the gradient coil 14 and a transmission coil power supply 23b that supplies power to the transmission coil 15. A switching power supply is used for the gradient coil power supply 23a. By the use of the switching power supply, it is possible to achieve higher speed scanning and higher power efficiency.

When an operator 32 in the monitor room 20 sends an instruction to the cabinet 23 via the operating console 22, the gradient coil power supply 23a and the transmission coil power supply 23b of the cabinet 23 drive the gradient coil 14 and the transmission coil 15 in accordance with the instruction. Thus, an image of the subject 31 can be obtained by using the MRI system 100.

Then, how to obtain an image of the subject 31 is explained.

When obtaining an image of the subject 31, the reception coils 19 are attached to the subject 31. Then, the subject 31 is moved into the bore 16 of the MRI main body 12.

Figure 5:
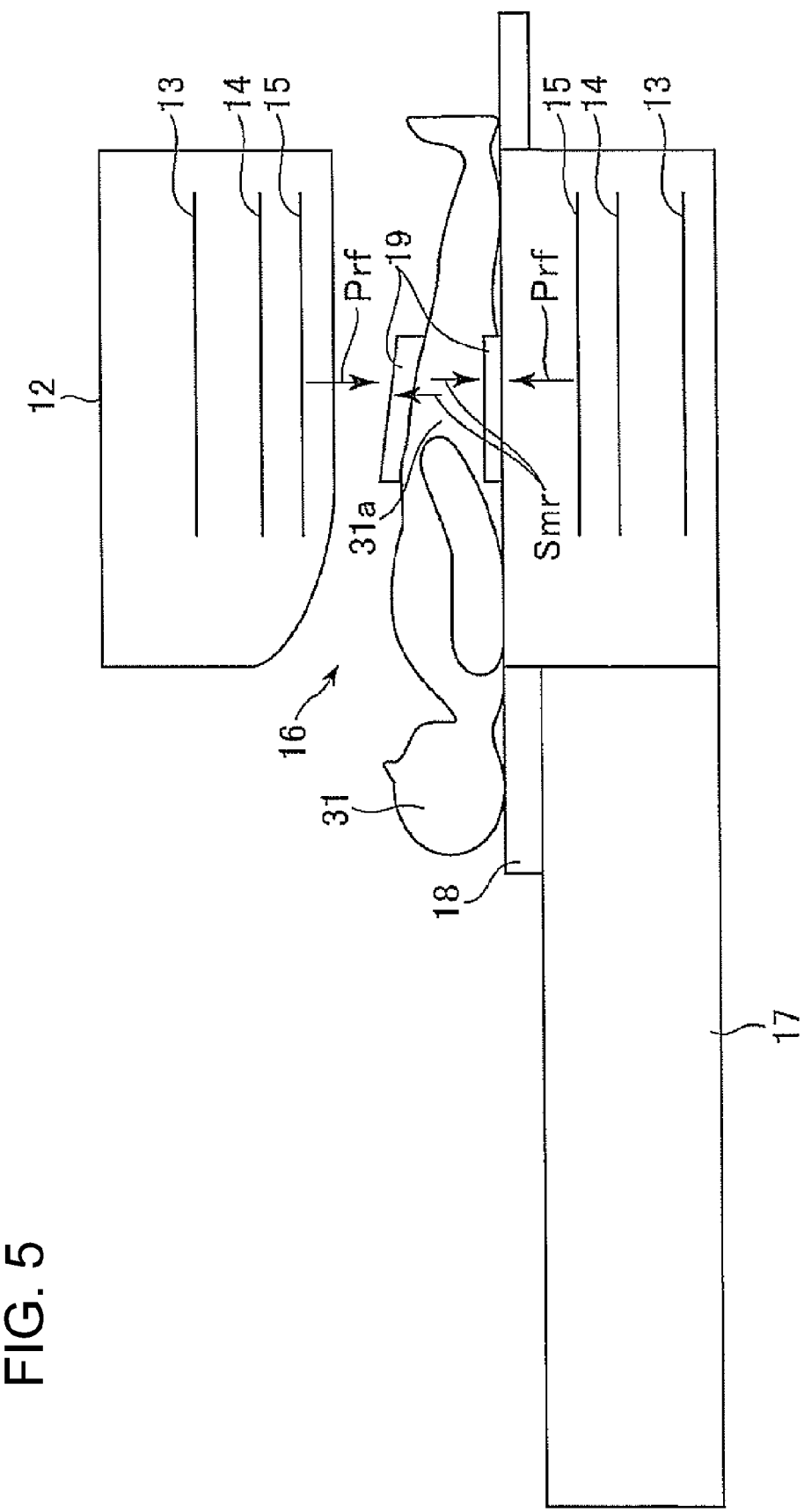
FIG. 5 depicts a scene when a subject has been moved into a bore of the MRI apparatus shown in FIG. 2.

FIG. 5 depicts a scene when the subject 31 has been moved into the bore 16.

After the subject 31 has been moved into the bore 16, the gradient coil 14 applies gradient pulses and the transmission coil applies RF (Radio Frequency) pulses Prf to the subject 31.

The RF pulses Prf are high frequency pulses. If the MRI apparatus 11 is, for example, a 1.5 T (tesla) machine, the RF pulses Prf have a center frequency at f0=64 MHz. When such RF pulses Prf are applied, the blocking circuits BL of the coil elements 191 and 192 operate (see FIG. 4) to bring the node N1 to node N2 segments of the coil elements 191 and 192 to a high impedance state. Hence, the coil elements 191 and 192 are set disabled. In consequence, it is possible to sufficiently reduce or substantially zero out an RF pulse current Irf (see FIG. 4) that flows in the main current path section ML due to electromagnetic induction of the RF pulses Prf.

In consequence of the transmission of the RF pulses Prf, MR signals Smr are generated from the subject 31. Like the RF pulses Prf, the MR signals Smr are also high frequency signals. If the MRI apparatus 11 is, for example, a 1.5 T (tesla) machine, the MR signals Smr have a center frequency at f0=64 MHz. However, when the MR signals Smr are received from the subject 31, the blocking operation of the blocking circuits BL are deactivated and the coil elements 191 and 192 become enabled. In consequence, a sufficiently large MR current Imr (see FIG. 4) flows in the main current path section ML due to electromagnetic induction of the MR signals Smr.

Accordingly, the RF pulse current Irf becomes sufficiently smaller than the MR current Imr and an MR image in which artifacts attributed to RF pulses Prf are reduced is obtained.

In the present embodiment, the coil elements 191 and 192 each include not only the blocking circuit BL, but also the low frequency current blocking section 29 (see FIG. 4). Then, the reason why they have the low frequency current blocking section 29 is explained. To explain this reason, let us consider a coil element that has the blocking circuit BL, but does not have the low frequency current blocking section 29.

Figure 6:
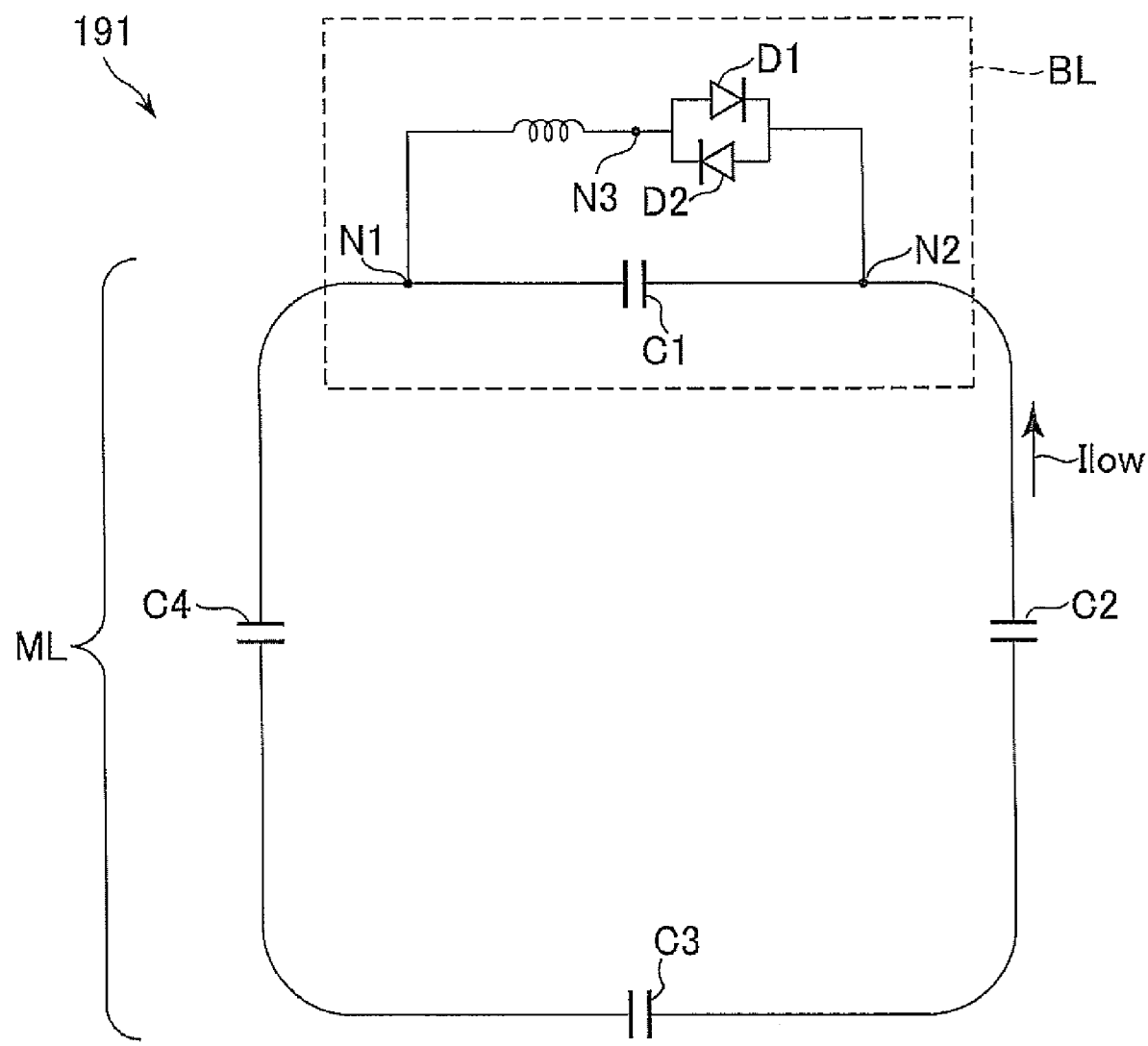
FIG. 6 is a diagram showing a known coil element that has a blocking circuit, but does not have a low frequency current blocking section.

FIG. 6 is a diagram showing a known coil element 191' that has the blocking circuit BL, but does not have the low frequency current blocking section 29.

The coil element 191' does not have the low frequency current blocking section 29, but includes the blocking circuit BL as in the coil elements 191 and 192. Instead of the coil elements 191 and 192, the use of the coil element 191' shown in FIG. 6 is conceivable. However, the use of the coil element 191' poses the following problem.

Figure 7:
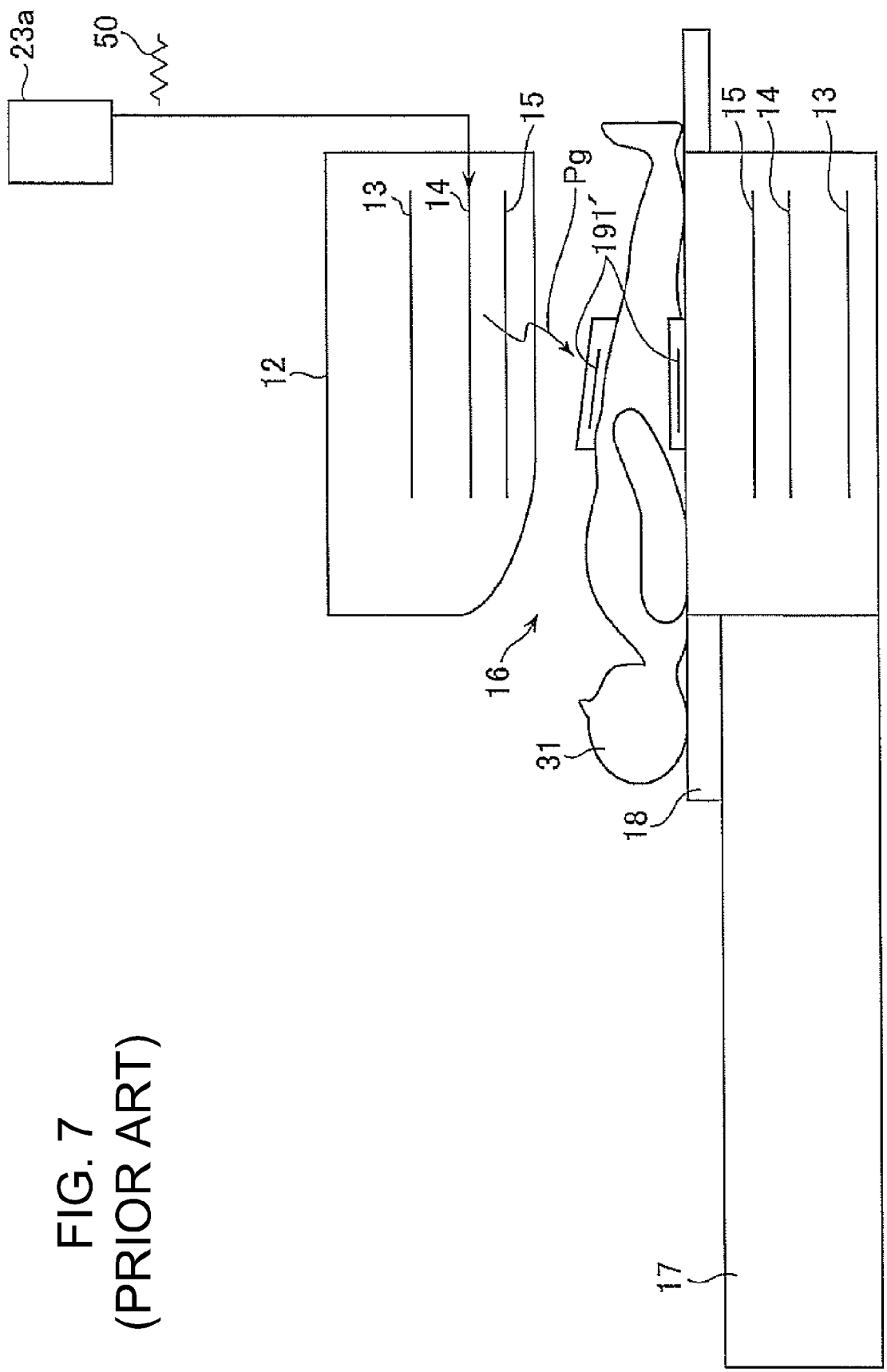
FIG. 7 is an illustration for explaining a problem arising with the use of the coil element shown in FIG. 6.

FIG. 7 is an illustration for explaining the problem arising with the use of the coil element 191' shown in FIG. 6.

As described above, the gradient coil 14 of the MRI apparatus 11 is supplied with power from the switching power supply 23a (see FIG. 1). The switching operation of the switching power supply 23a typically takes place at a switching frequency in the range of several kHz to several hundred kHz. Hence, due to the switching operation of the switching power supply 23a, a ripple 50 that fluctuates in the range of several kHz to several hundred kHz may appear in the output of the switching power supply 23a. When the ripple 50 appears in the output of the switching power supply 23a, the ripple 50 is supplied to the gradient coil 14. Consequently, from the gradient coil 14, gradient pulses Pg affected by the ripple 50 are applied to the subject 31. Since the ripple fluctuates in the low frequency such as the range of several kHz and several hundred kHz as above, a low frequency current Ilow (see FIG. 6) is thought to flow in the main current path section ML of the coil element 191' due to electromagnetic conduction of the gradient pulses Pg affected by the ripple 50.

In a case that such a low frequency current Ilow is unignorably large, artifacts such as ghosts may appear in an MR image. To reduce artifacts such as ghosts attributed to the low frequency current Ilow, the coil elements 191 and 192 in the present embodiment include the low frequency current blocking section 29. Then, the reason why artifacts such as ghosts can be reduced by the included low frequency current blocking section 29 is explained with reference to FIG. 8.

Figure 8:
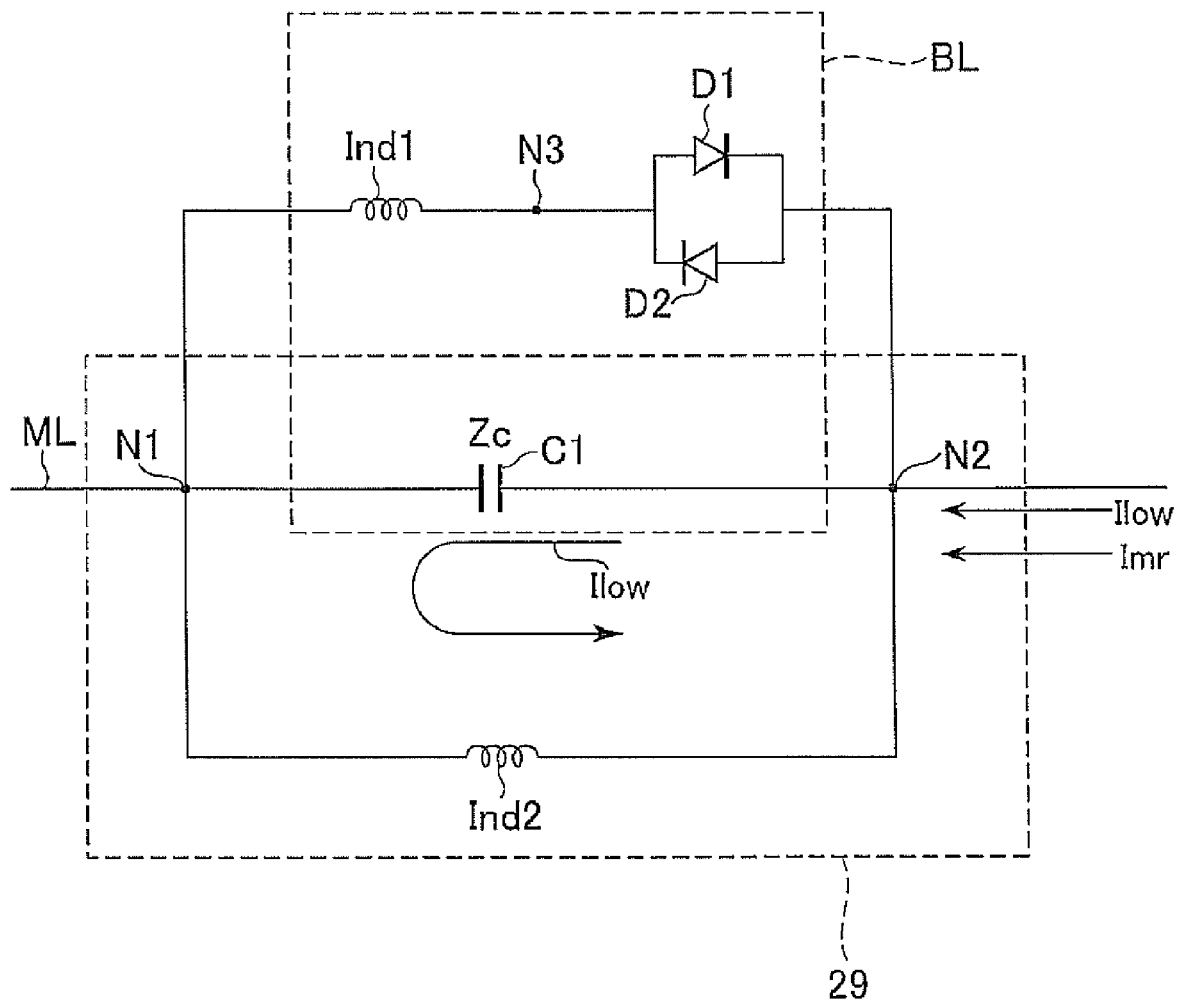
FIG. 8 is a diagram showing a node to node circuit segment of the coil elements and shown in FIG. 3.

FIG. 8 is a diagram showing a node N1 to node N2 circuit segment of the coil elements 191 and 192.

As already noted, the frequency of the ripple 50 appearing in the output of the switching power supply 23a falls within the range of several tens of kHz to several hundred kHz, and the low frequency current Ilow also has a frequency in the range of several tens of kHz to several hundred kHz. Accordingly, a capacitance value of the capacitor C1 and an inductance value of the inductor Ind2 are set so that the low frequency current blocking section 29 has a resonance peak at a frequency in the range of several tens of kHz to several hundred kHz. Therefore, even if the low frequency current Ilow arises in the coil elements 191 and 192, most of the low frequency current Ilow becomes a low frequency current Ilow' flowing through the low frequency current blocking section 29 and this current is consumed by the low frequency current blocking section 29. In consequence, the low frequency current blocking section 29 becomes to have a high impedance to the low frequency current Ilow and the low frequency current Ilow hardly flows in the main current path section ML. Thus, artifacts (ghosts) that may occur due to the ripple 50 are reduced. In this way, the low frequency current blocking section 29 is able to make the low frequency current Ilow sufficiently lower than the MR current Imr or substantially zero out the Ilow current by cooperation of the inductor Ind2 with the capacitor C1.

In the present embodiment, the larger the frequency of the current, the smaller will be the impedance Zc of the capacitor C1 in the low frequency current blocking section 29. Hence, the impedance Zc of the capacitor C1 at the center frequency (e.g., 64 MHz) of the MR current Imr is smaller than the impedance Zc of the capacitor C1 at the frequency (in the range of several tens of kHz to several hundred kHz) of the low frequency current Ilow. It is thus possible to ensure that a sufficiently large MR current Imr flows in the main current path section ML.

In the present embodiment, the low frequency current blocking section 29 consists of the capacitor C1 and the inductor Idn2. However, a combination of circuit sections different from the combination of the capacitor C1 and the inductor Idn2 may be used, provided that the low frequency current Ilow can be blocked from flowing in the main current path section ML as practicably as possible.

In the present embodiment, the capacitor C1 that is a part of the low frequency current blocking section 29 is also employed as a part of the blocking circuit BL. However, a component of the blocking circuit BL may not be employed commonly as a component of the low frequency current blocking section 29, provided that the low frequency current Ilow can be blocked from flowing in the main current path section ML as practicably as possible.

Further, in the present embodiment, the solution provided by the invention is described in the case in which noise with a frequency (in the range of several kHz to several hundred Hz) smaller than the center frequency f0 (e.g., 64 MHz) of the RF pulses Prf is applied to the coil elements 191 and 192. However, by the application of the invention, it is possible to reduce artifacts attributed to noise with a frequency smaller than several kHz as well as artifacts attributed to noise with a frequency larger than several hundred Hz (e.g., a frequency larger than the center frequency f0 of the MR signals Smr).

In the present embodiment, the reception coil 19 has a receiving function to receive the MR signals Smr from the subject 31, but does not have a transmission function to transmit pulses to the subject 31. However, the reception coil 19 may be configured to have the transmission function in addition to the receiving function.

Many widely different embodiments of the invention may be configured without departing from the spirit and the scope of the present invention. It should be understood that the present invention is not limited to the specific embodiments described in the specification, except as defined in the appended claims.

What is claimed is:

1. A coil comprising a coil element configured to receive MR signals with a first frequency from a subject, said coil element comprising:
   a main current path section configured to conduct an MR current with the first frequency, the MR current arising due to electromagnetic induction of the MR signals; and
   a current blocking section configured to reduce an electromagnetic current flowing in said main current path section such that the electromagnetic current is less than the MR current, wherein the electromagnetic current is due to electromagnetic induction of electromagnetic waves with a second frequency different from the first frequency, wherein the second frequency is within a range of several kHz to several hundred kHz.

2. The coil according to claim 1, wherein the second frequency is smaller than the first frequency.

3. The coil according to claim 2, wherein said coil element comprises a blocking circuit configured to reduce an RF pulse current flowing in said main current path section to be less than the MR current due to electromagnetic induction of RF pulses with the first frequency.

4. The coil according to claim 2, wherein said current blocking section has a resonance peak at the second frequency.

5. The coil according to claim 4, wherein said coil element comprises a blocking circuit configured to reduce an RF pulse current flowing in said main current path section to be less than the MR current due to electromagnetic induction of RF pulses with the first frequency.

6. The coil according to claim 4, wherein said main current path section comprises a first circuit section in which an impedance at the first frequency is smaller than an impedance at the second frequency.

7. The coil according to claim 6, wherein said coil element comprises a blocking circuit configured to reduce an RF pulse current flowing in said main current path section to be less than the MR current due to electromagnetic induction of RF pulses with the first frequency.

8. The coil according to claim 6, wherein said current blocking section comprises a second circuit section configured to reduce the electromagnetic current to be less than the MR current in cooperation with said first circuit section.

9. The coil according to claim 8, wherein said coil element comprises a blocking circuit configured to reduce an RF pulse current flowing in said main current path section to be less than the MR current due to electromagnetic induction of RF pulses with the first frequency.

10. The coil according to claim 8, wherein said second circuit section is connected in parallel to said first circuit section.

11. The coil according to claim 10, wherein said coil element comprises a blocking circuit configured to reduce an RF pulse current flowing in said main current path section to be less than the MR current due to electromagnetic induction of RF pulses with the first frequency.

12. The coil according to claim 10, wherein said first circuit section has a capacitance and said second circuit section has an inductance.

13. The coil according to claim 12, wherein said coil element comprises a blocking circuit configured to reduce an RF pulse current flowing in said main current path section to be less than the MR current due to electromagnetic induction of RF pulses with the first frequency.

14. The coil according to claim 1, wherein said coil element comprises a blocking circuit configured to reduce an RF pulse current flowing in said main current path section to be less than the MR current due to electromagnetic induction of RF pulses with the first frequency.

15. An MRI system comprising:
a coil comprising a coil element configured to receive MR signals with a first frequency from a subject, said coil element comprising:
a main current path section configured to conduct an MR current with the first frequency, the MR current arising due to electromagnetic induction of the MR signals; and
a current blocking section configured to reduce an electromagnetic current flowing in said main current path section such that the electromagnetic current is less than the MR current, wherein the electromagnetic current is due to electromagnetic induction of electromagnetic waves with a second frequency different from the first frequency;
a transmission coil configured to apply RF pulses;
a gradient coil configured to apply gradient pulses; and
a switching power supply configured to supply power to said gradient coil and to operate at a switching frequency lower than a center frequency of the RF pulses.

16. An MRI system comprising:
a coil comprising a coil element configured to receive MR signals with a first frequency from a subject, said coil element comprising:
a main current path section configured to conduct an MR current with the first frequency, the MR current arising due to electromagnetic induction of the MR signals; and
a current blocking section configured to reduce an electromagnetic current flowing in said main current path section such that the electromagnetic current is less than the MR current, wherein the electromagnetic current is due to electromagnetic induction of electromagnetic waves with a second frequency different from the first frequency, wherein the second frequency is smaller than the first frequency;
a transmission coil configured to apply RF pulses;
a gradient coil configured to apply gradient pulses; and
a switching power supply configured to supply power to said gradient coil and to operate at a switching frequency lower than a center frequency of the RF pulses.

17. An MRI system comprising:
a coil comprising a coil element configured to receive MR signals with a first frequency from a subject, said coil element comprising:
a main current path section configured to conduct an MR current with the first frequency, the MR current arising due to electromagnetic induction of the MR signals; and
a current blocking section configured to reduce an electromagnetic current flowing in said main current path section such that the electromagnetic current is less than the MR current, wherein the electromagnetic current is due to electromagnetic induction of electromagnetic waves with a second frequency different from the first frequency, wherein the second frequency is smaller than the first frequency and within a range of several kHz to several hundred kHz;
a transmission coil configured to apply RF pulses;
a gradient coil configured to apply gradient pulses; and
a switching power supply configured to supply power to said gradient coil and to operate at a switching frequency lower than a center frequency of the RF pulses.

18. An MRI system comprising:
a coil comprising a coil element configured to receive MR signals with a first frequency from a subject, said coil element comprising:
a main current path section configured to conduct an MR current with the first frequency, the MR current arising due to electromagnetic induction of the MR signals; and
a current blocking section configured to reduce an electromagnetic current flowing in said main current path section such that the electromagnetic current is less than the MR current, wherein the electromagnetic current is due to electromagnetic induction of electromagnetic waves with a second frequency different from the first frequency, wherein the second frequency is smaller than the first frequency, and wherein said current blocking section has a resonance peak at the second frequency;
a transmission coil configured to apply RF pulses;
a gradient coil configured to apply gradient pulses; and
a switching power supply configured to supply power to said gradient coil and to operate at a switching frequency lower than a center frequency of the RF pulses.

* * * * *